US008604958B2

(12) United States Patent
Pfann et al.

(10) Patent No.: US 8,604,958 B2
(45) Date of Patent: Dec. 10, 2013

(54) RF DAC WITH CONFIGURABLE DAC MIXER INTERFACE AND CONFIGURABLE MIXER

(75) Inventors: Peter Pfann, Munich (DE); Markus Schimper, Moosinnig (DE); Jose Moreira, Munich (DE); Timo Gossmann, Neubiberg (DE)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/106,963

(22) Filed: May 13, 2011

(65) Prior Publication Data

US 2012/0286983 A1 Nov. 15, 2012

(51) Int. Cl.
*H03M 1/66* (2006.01)

(52) U.S. Cl.
USPC .......................................... 341/144; 375/295

(58) Field of Classification Search
None
See application file for complete search history.

(56) References Cited

U.S. PATENT DOCUMENTS

| | | | |
|---|---|---|---|
| 4,408,352 A | 10/1983 | Dudding | |
| 4,424,492 A | 1/1984 | Potter | |
| 5,270,715 A | 12/1993 | Kano | |
| 5,450,044 A | 9/1995 | Hulick | |
| 5,635,936 A | 6/1997 | Rybicki | |
| 5,886,640 A | 3/1999 | Wang et al. | |
| 6,259,301 B1 | 7/2001 | Gailus et al. | |
| 6,822,595 B1 | 11/2004 | Robinson | |
| 7,035,595 B1* | 4/2006 | Kim et al. | 455/73 |
| 7,839,231 B1 | 11/2010 | Groe et al. | |
| 8,315,586 B2 | 11/2012 | Aoki | |
| 2005/0258992 A1* | 11/2005 | Fontaine et al. | 341/144 |
| 2009/0075601 A1* | 3/2009 | Nezhad-Ahmadi et al. | 455/73 |
| 2009/0111414 A1 | 4/2009 | Sahota et al. | |
| 2010/0317300 A1 | 12/2010 | Behzad | |
| 2011/0085616 A1* | 4/2011 | Kuttner | 375/295 |

FOREIGN PATENT DOCUMENTS

| | | |
|---|---|---|
| EP | 0966095 A1 | 12/1999 |
| JP | S5470713 A | 6/1979 |
| JP | 56157842 U | 11/1981 |
| JP | 56157843 U | 11/1981 |
| JP | H0457511 A | 2/1992 |
| JP | H04158626 A | 6/1992 |
| JP | H05327357 A | 12/1993 |
| JP | 2007013560 A | 1/2007 |
| WO | 2006033722 A2 | 3/2006 |
| WO | 2008133489 A1 | 11/2008 |
| WO | 2009036399 A1 | 3/2009 |
| WO | 2009149097 A1 | 12/2009 |
| WO | 2010068504 A2 | 6/2010 |

OTHER PUBLICATIONS

Office Action dated Oct. 18, 2012 in connection with U.S. Appl. No. 13/106,992.
U.S. Appl. No. 13/106,992, filed May 13, 2011.
Notice of allowance dated Feb. 5, 2013 for U.S. Appl. No. 13/106,992.

* cited by examiner

*Primary Examiner* — Howard Williams
(74) *Attorney, Agent, or Firm* — Eschweiler & Associates, LLC (57) ABSTRACT

One embodiment of the present disclosure relates to a circuit. The circuit includes a digital to analog converter (DAC) configured to convert a time-varying, multi-bit digital value to a corresponding time-varying output current. The circuit also includes a mixer module downstream of the DAC and comprising a plurality of mixers. A control block is configured to selectively steer output current from the DAC to different mixers of the mixer module. Other techniques are also described.

23 Claims, 8 Drawing Sheets

| | Digital Value | I-sources enabled | I_column0 | I_column1 | I_column2 | Control | I_mixer0 | I_mixer1 | I_mixer2 | I_mixer3 |
|---|---|---|---|---|---|---|---|---|---|---|
| 502 → | 001001 | $S_{0,0}$ | 1μA | 0 | 0 | x001 | 1μA | 0 | 0 | 0 |
| 504 → | 001001 | $S_{0,0}$ | 1μA | 0 | 0 | x008 | 0 | 1μA | 0 | 0 |
| 506 → | 001001 | $S_{0,0}$ | 1μA | 0 | 0 | x040 | 0 | 0 | 1μA | 0 |
| 508 → | 001001 | $S_{0,0}$ | 1μA | 0 | 0 | x200 | 0 | 0 | 0 | 1μA |
| | 001011 | $S_{0,0}$; $S_{0,1}$ | 1μA | 1μA | 0 | x003 | 2μA | 0 | 0 | 0 |
| | 001011 | $S_{0,0}$; $S_{0,1}$ | 1μA | 1μA | 0 | x018 | 0 | 2μA | 0 | 0 |
| | 001011 | $S_{0,0}$; $S_{0,1}$ | 1μA | 1μA | 0 | x0A0 | 0 | 0 | 2μA | 0 |
| | 001011 | $S_{0,0}$; $S_{0,1}$ | 1μA | 1μA | 0 | x600 | 0 | 0 | 0 | 2μA |
| | 001011 | $S_{0,0}$; $S_{0,1}$ | 1μA | 1μA | 0 | x011 | 1μA | 1μA | 0 | 0 |
| | 001011 | $S_{0,0}$; $S_{0,1}$ | 1μA | 1μA | 0 | x018 | 1μA | 0 | 1μA | 0 |
| | 001011 | | ... | ... | ... | ... | ... | ... | ... | ... |
| 516 → | 001111 | $S_{0,0}$; $S_{0,1}$; $S_{0,2}$ | 1μA | 1μA | 1μA | x007 | 3μA | 0 | 0 | 0 |
| 518 → | 011001 | $S_{0,0}$; $S_{1,0}$ | 2μA | 0 | 0 | | | | | |
| 520 → | 011011 | $S_{0,0}$; $S_{0,1}$; $S_{1,0}$ | 0 | 2μA | 2μA | | | | | |
| 522 → | 011111 | $S_{0,0}$; $S_{0,1}$; $S_{1,0}$; $S_{0,2}$ | 2μA | 2μA | 2μA | | | | | |
| 524 → | 111001 | $S_{0,0}$; $S_{1,0}$; $S_{2,0}$ | 3μA | 0 | 0 | | | | | |
| 526 → | 111011 | $S_{0,0}$; $S_{1,0}$; $S_{2,0}$; $S_{0,1}$; $S_{1,1}$; $S_{2,1}$ | 3μA | 3μA | 0 | | | | | |
| 528 → | 111111 | $S_{0,0}$; $S_{1,0}$; $S_{2,0}$; $S_{0,1}$; $S_{1,1}$; $S_{2,1}$; $S_{0,2}$; $S_{1,2}$; $S_{2,2}$ | 3μA | 3μA | 3μA | | | | | |

RF DAC WITH CONFIGURABLE DAC MIXER INTERFACE AND CONFIGURABLE MIXER

BACKGROUND

Wireless communication may be used to transfer information over many distances, ranging from short distances (a few meters as in television remote control) to long distances (thousands or millions of kilometers for radio communications). Wireless communication encompasses various types of fixed, mobile, and portable two-way radios, cellular telephones, personal digital assistants (PDAs), and wireless networking. Typical wireless devices communicate according to predetermined communication protocols, such as IEEE communication standards or other telecommunications standards, for example. Although there are many different communication standards, any given standard specifies precise rules for communication, thereby helping to ensure that wireless devices from different manufacturers communicate effectively with one another.

Modern wireless communication devices are integrating more and more communication functions into a single device. For example, a single conventional mobile phone can transmit and receive data using multiple communication standards, such as 2G and 3G telecommunication standards. These standards can require different transmission powers, different modulation techniques, different transmission frequencies, and the like.

Figure 1:
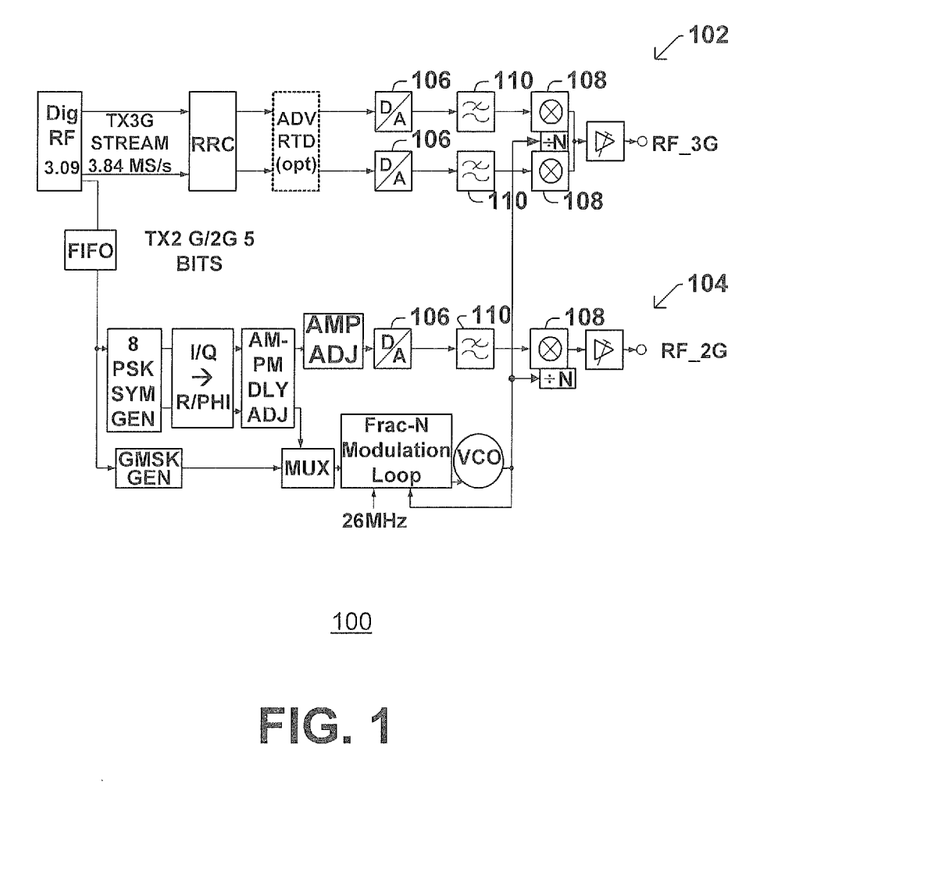
FIG. 1 is a schematic diagram of a conventional transceiver that includes multiple transmission paths and filters thereon.

In order to allow a single wireless device to transmit according to different communication standards, conventional wireless communication devices include multiple transmission paths and/or reception paths. For example, FIG. 1 shows a portion of a conventional wireless transceiver 100 that includes a first transmission path 102 on which a 3G signal is transmitted and a second transmission path 104 on which a 2G signal is transmitted. Both transmission paths 102, 104 include digital to analog converters (DACs) 106 and mixers 108, wherein low-pass filters 110 are disposed between the DACs 106 and their corresponding mixers 108.

Figure 2:
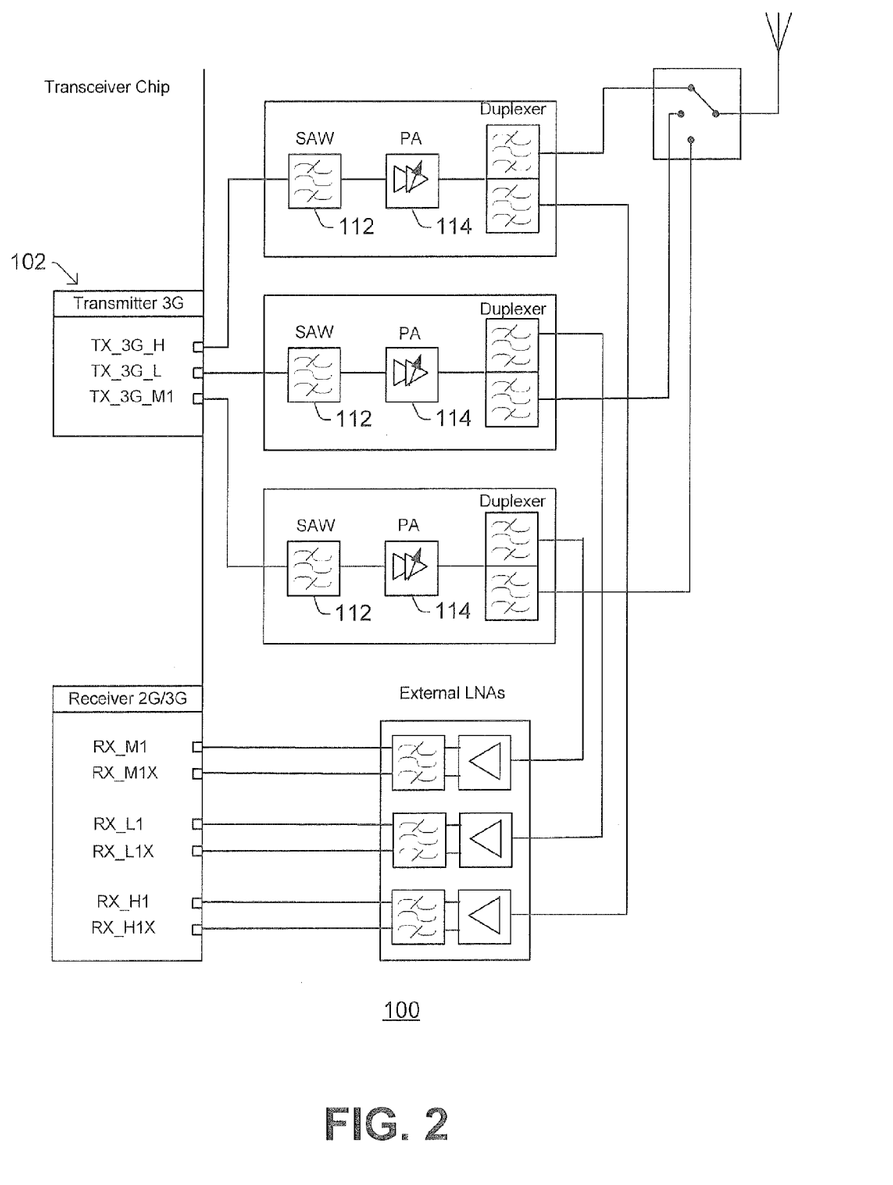
FIG. 2 is a schematic of transceiver including a transmission path.

For a reasonable current consumption, a 3G vector modulator is weak in noise performance, so inter-stage surface acoustical wave (SAW) filters 112 are required for each transmission band, as shown in FIG. 2. These SAW filters 112 are coupled between the output of transmission path 102 (which supports multiple transmission bands, e.g., TX_3G_H, TX_3G_L, TX_3G_M1), and corresponding power amplifiers (PA) 114 used for transmission over the corresponding bands. The need for the different SAW filters 112 increases the pin count of the transceiver 100, as well as the size of the printed circuit board (PCB), and the overall bill of materials (BOM).

In view of these conventional communication devices, the inventors have appreciated that it would be helpful from a cost and power perspective to provide a single, flexible transmission path that is shared for multiple communication standards rather than using separate transmission paths for each communication standard. Also, it would be beneficial to eliminate the need for SAW filters to reduce the pin count of the transceiver, the size of the printed circuit board (PCB), and the overall bill of materials (BOM) used for the transceiver.

DETAILED DESCRIPTION

The claimed subject matter is now described with reference to the drawings. In the following description, for purposes of explanation, numerous specific details are set forth in order to provide a thorough understanding of the claimed subject matter. It may be evident, however, that the claimed subject matter may be practiced without these specific details.

Techniques disclosed herein generate a time-varying current using a digital to analog converter (DAC), and selectively steer current from the DAC to different mixers of a mixer module. In many embodiments, this configuration limits the need for filters on the transmission path, thereby limiting the overall circuitry needed for the transceiver, relative to conventional solutions.

Figure 3:
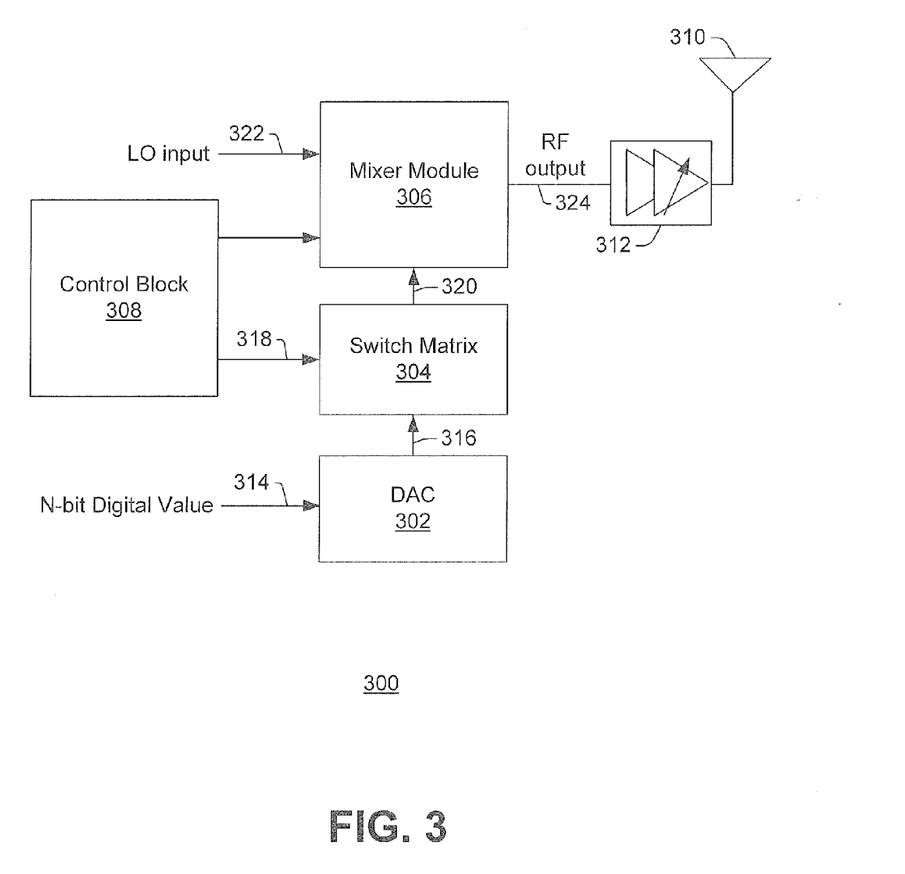
FIG. 3 is a block diagram of a transmitter in accordance with some embodiments.

FIG. 3 shows an example of a circuit 300 in accordance with some embodiments. As will be appreciated in more detail below, the circuit 300 provides a single transmission path that can be used for one or more communication protocols, wherein the circuit 300 can potentially transmit using a different transmission power to carry out different communication protocols (and/or can use different transmission powers within a given communication protocol). For example, in some implementations, the circuit can transmit according to at least two of: Global System for Mobile Communication (GSM), Gaussian minimum shift keying (GMSK), Enhanced Data Rates for GSM Evolution) EDGE, Universal Mobile Telecommunication Systems (UMTS), Long Term Evolution (LTE), WiMax, Bluetooth, a wireless 801.11 protocol, and/or other communication protocols.

The circuit 300 includes a digital to analog converter (DAC) 302, a switch matrix 304, a mixer module 306, and a control block 308; which are operably coupled as shown. The mixer module 306 includes a plurality of mixers, which are operable to deliver an RF output signal to an RF antenna 310 through a power amplifier 312. In some embodiments, no filters are required between the DAC 302 and the mixer module 306, and SAW filters are not required between the mixer module 306 and the power amplifier 312. Hence, the circuit 300 tends to reduce area and power consumption, relative to conventional solutions. It will be appreciated that not all of these components are required in all implementations—for example the power amplifier 312 can be omitted in some embodiments.

During operation, the output power range of the antenna 310 is divided into M sub-ranges (M can be an integer ranging from 2 to nearly infinity). At any given time, an N-bit digital value (N can be an integer ranging from 1 to nearly infinity), which is indicative of the output power to be used at that time, is received on an input (314) of the DAC 302. The DAC 302 converts the N-bit digital value to a corresponding time-varying output current provided at an output (316) of the DAC 302. Thus, by changing the N-bit digital value on 314 over time, the output current on 316 can be changed over time to correspond to a desired transmission power.

The switch matrix 304, under the direction of the control block 308, is configured to steer various amounts of output current from the DAC 302 to different mixers of the mixer module 306 based on a control signal on 318 from the control block 308. The mixer module 306 then modulates the signal from switch matrix output 320 with an LO signal 322 to deliver an RF signal 324 at a desired power level to the power amplifier 312. The power amplifier 312 then amplifies the RF signal 324, thereby facilitating transmission over the RF antenna 310 at the desired transmission power.

The output of the control block 308 can depend on different transmission conditions such as DAC instantaneous value, DAC biasing condition, output power, transmission standard, and crest factor, among others. For example, if a relatively high power signal is to be transmitted from the RF antenna 310 during a first time (e.g., while a first communication protocol is employed), the switch matrix 304 steers a relatively large current to the mixer module 306, such that the RF antenna 310 transmits a relatively intense RF signal. In contrast, if a relatively low power signal is to be transmitted from the RF antenna during a second time (e.g., while a second communication protocol is employed), the switch matrix 304 steers a relatively small current to the mixer module 306, such that the RF antenna 310 transmits a relatively low-intensity RF signal. Typically, the DAC 302 and switch matrix 304 work in coordinated fashion to deliver a large number of output transmission powers via the antenna 310, thereby helping a single transmission path flexibly to carry out multiple communication protocols having different transmission powers.

It will be appreciated that the control block 308 can take various forms depending on the implementation. In some embodiments, the control block can include a microprocessor that executes a series of instructions (e.g., software and/or firmware) as accessed from a memory unit. In other embodiments the control block can be an application specific integrated circuit (ASIC) or some other logic unit (e.g., FPGA, baseband processor).

Figure 4:
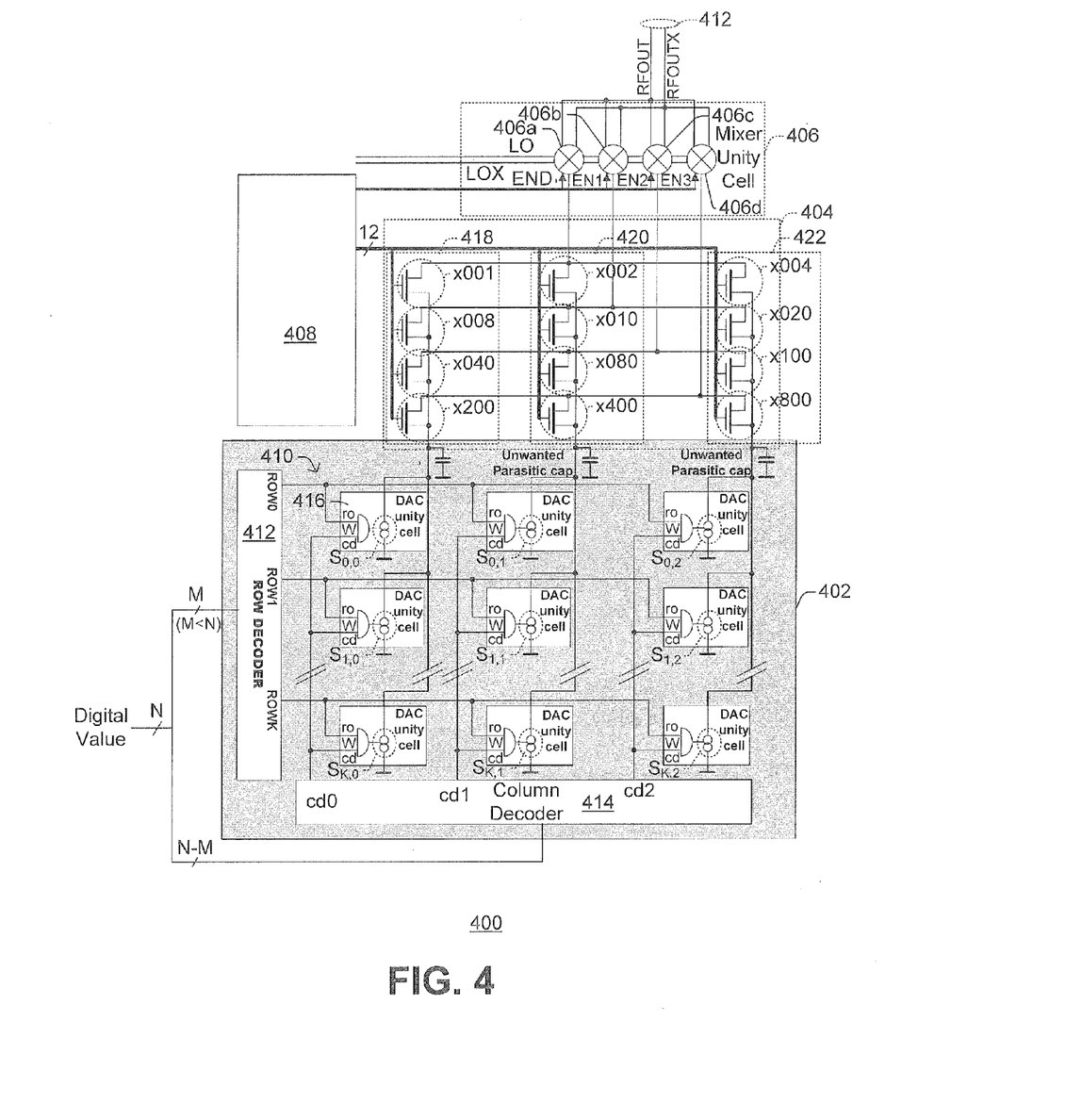
FIG. 4 is a schematic diagram of a circuit that can be included in a transmitter in accordance with some embodiments.

FIG. 4 shows another circuit 400 in accordance with some embodiments. Like FIG. 3's implementation, FIG. 4's circuit 400 includes a digital to analog converter (DAC) 402, a switch matrix 404, a mixer module 406, and a control block 408; which are operably coupled as shown.

The DAC 402 receives a time-varying N-bit digital value and converts it to a time-varying output current. To facilitate this functionality, the DAC comprises a number of current sources 410 arranged in a number of rows and columns (where individual current sources are labeled as $S_{row\text{-}column}$). The current sources 410 can be selectively and independently activated by a row decoder 412 and column decoder 414, which collectively enable logical gates (e.g., AND gate 416) having their outputs coupled to respective control terminals of the current sources 410. The current sources along a column are arranged so their output currents add together if they are concurrently enabled. It will be appreciated that, although only three columns are illustrated for sake of simplicity, other non-illustrated embodiments can include any number of columns. Also, although logical AND gates are illustrated, any number of other logical gates could also be used.

The switch matrix 404 comprises a number of switching elements coupled between the DAC 402 and the mixer module 406. The switching elements are arranged to selectively steer different amounts of current from the DAC 402 to the mixers of the mixer module 406. For example, a first subgroup of switching elements 418 have respective first contacts coupled to a first column of the DAC 402 and have respective second contacts coupled to different mixers in the plurality of mixers 406. A second subgroup of switching elements 420 have respective first contacts coupled to a second column of the DAC and have respective second contacts coupled to different mixers in the plurality of mixers. A third subgroup of switching elements 422 have respective first contacts coupled to a third column of the DAC 402 and have respective second contacts coupled to different mixers in the plurality of mixers. The matrix does not need to be fully populated. Switches can be removed if they are always open, replaced by shorts if they are always closed, or combined if they are switched simultaneously (see e.g., FIG. 7).

The mixer module 406 includes a number of mixers (e.g., 406a, 406b, 406c, 406d) having respective first and second inputs and having respective outputs. A first input of each mixer is coupled to a local oscillator (LO) line 410 on which an LO signal having an LO frequency is received. A second input for each mixer is coupled to an output of the switch matrix 404. The outputs of the mixers are coupled to a shared output 412. Upon receiving the LO signal and the signal from the switch matrix, a mixer outputs a mixed signal the shared output 412, where the mixed signal exhibits sums and differences of the frequencies of the two input signals. The number of mixers can be any number, and in some embodiments the number of mixers can be different from the number of DAC columns.

As will be appreciated in more detail below, the control block 408 is configured to provide a control signal to the switch matrix 408 to selectively couple the output of the various current sources to the various mixers via the switches.

Figure 5:
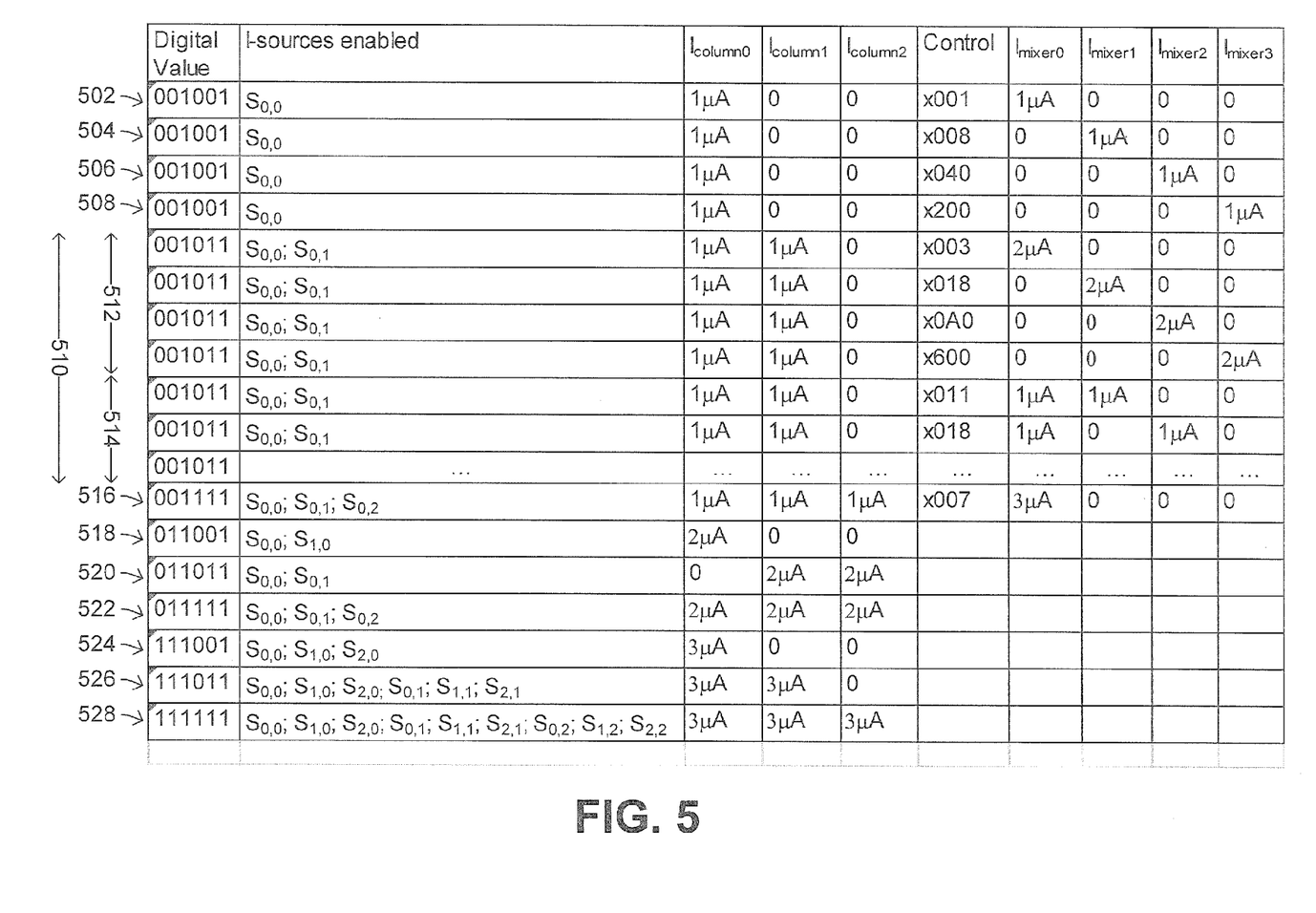
FIG. 5 is a chart illustrating some examples of digital values and control values that can be used to achieve various transmission conditions consistent with FIG. 4's embodiment.

An example of how the circuit of FIG. 4 can operate is now discussed with regards to FIG. 5. In FIG. 5's example, the current sources $S_{0,0}$-$S_{k,2}$ are each configured to drive a unit current (e.g., 1 µA of current in this example). For example, in many embodiments the current sources can be realized as MOS-type transistors, which all have equal width to length ratios. The mixers in this example are also assumed to have the same geometries as one another. This configuration is advantageous in some respects because it may help to provide better matching and less noise than other embodiments where different geometries are used for the current sources and/or mixers. Of course, the present disclosure is not limited to current sources (or mixers) having the same size, and in other embodiments current sources (or mixers) could be sized differently from one another.

In 502 of the chart, a digital value of 001001 (of which the first three bits are provided to row decoder 402 and the second three bits are provided to column decoder 404) enables the current sources on Row0 and Column0 of the DAC 402 (i.e., current source $S_{0,0}$ is enabled). The control signal to the switch matrix 404 is set to 0x001 (i.e., 000000000001), which couples the first column of the DAC to the first mixer 406a. In this way, 1 µA of current is delivered to mixer 406a, which delivers a first output power to an RF antenna downstream of the mixer module.

In 504 of the chart, a digital value of 001001 again enables the current source on Row0 and Column0 (i.e., current source $S_{0,0}$ is enabled). However, the control signal is now set to 0x080 (i.e., 000000000100), which couples the first column of the DAC to the second mixer 406b, such that 1 µA of current is now delivered to the second mixer 406b. At 506 and 508, the control value is changed to steer the 1 µA of current to the third mixer 406c and fourth mixer 406d, respectively.

In 510, the digital value is changed to 001011, which enables the current sources on Row1 and Columns1-2 (i.e., current sources $S_{0,0}$; $S_{0,1}$ are enabled). Depending on how the control bits are set, the switch matrix 404 can deliver current from both sources to a single mixer (as shown by 512 where a 2 μA current summed from $S_{0,0}$; $S_{0,1}$ is delivered to various individual mixers); or can deliver the currents to different mixers (as shown by 514, where 1 μA currents from $S_{0,0}$; $S_{0,1}$ are delivered to different mixers).

Reference numerals 516-528 show other conditions in which the different amounts of current are steered from the DAC 402 to the mixer module 406 to facilitate desired functionality. It will be appreciated that FIG. 5 is merely a non-limiting example, and that it in no way limits the scope of the present disclosure.

Figure 6:
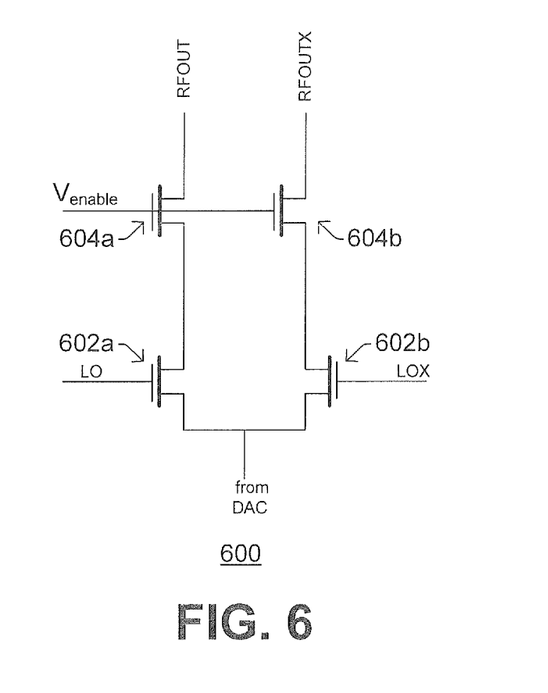
FIG. 6 is a block diagram of a mixer in accordance with some embodiments.

FIG. 6 shows an example of a mixer 600 (e.g., one of mixers 406a-406d in FIG. 4) in accordance with some embodiments. The mixer 600 includes a first pair of transistors 602a, 602b having respective control terminals on which a differential local oscillator (LO) signal is received. Respective sources of the first pair of transistors are coupled to a DAC via a switch matrix. Respective drains of the first pair of transistors are coupled to a second pair of transistors 604a, 604b. The second pair of transistors receives an enable signal on their respective gates. Because of this configuration, the first and second pairs of transistors 602, 604 can mix the signal from the DAC with the LO signal, and selectively deliver a modulated signal to a power amplifier and RF antenna downstream of the mixer 600.

Figure 7A:
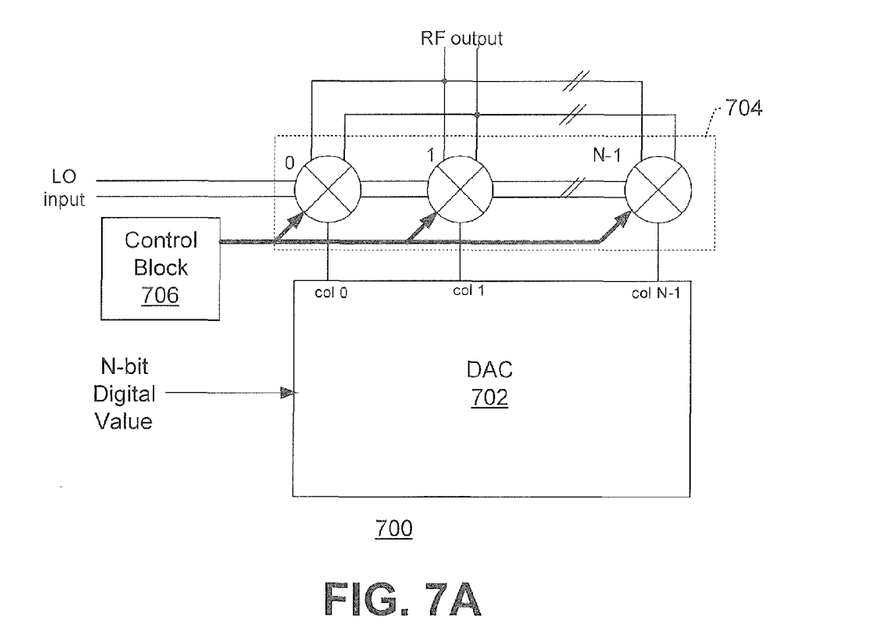
FIG. 7 is a block diagram of a circuit that can be included in a transmitter in accordance with some embodiments.
Figure 7B:
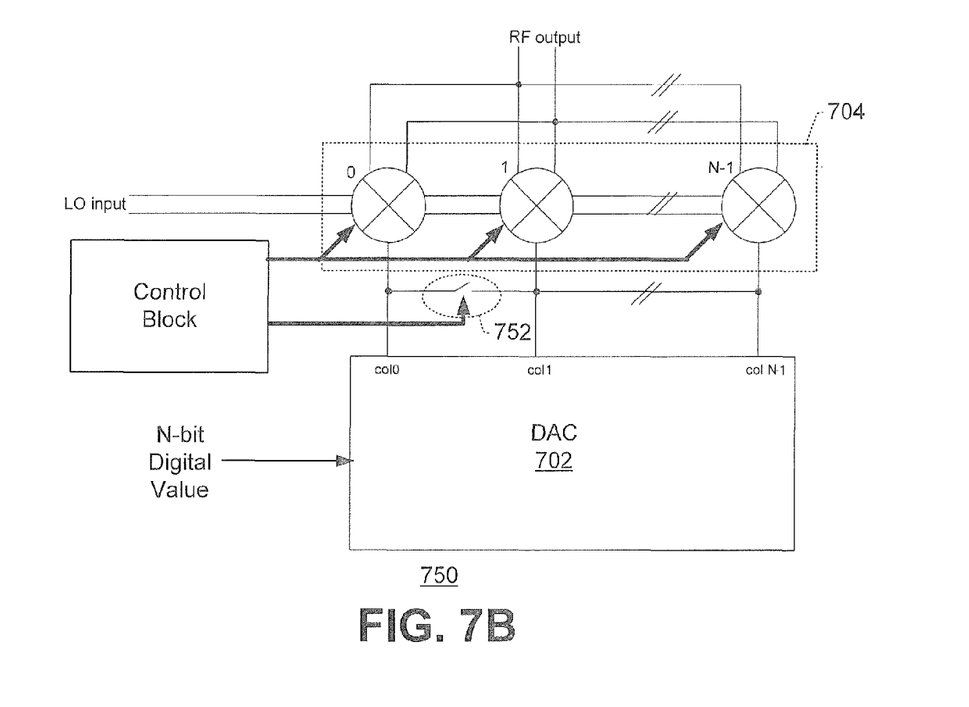

FIG. 7 shows another embodiment of a circuit 750 in accordance with another embodiment. In this embodiment, the DAC output columns col.1 through col. N-1 are shorted to one another, while DAC output column col0 is selectively coupled to the other columns via a switching element 752. The control block 752 provides a control signal to the switching element to selectively couple col0 to the other columns and to selectively enable the appropriate mixers. Hence, this embodiment provides a limited switching matrix that allows less flexibility than that of FIG. 4's embodiment. Although it provides less flexibility, however, this limited switching matrix with a single transistor also requires less circuitry than FIG. 4's embodiment, which correspondingly provides lower power consumption and a lower overall cost due to silicon area savings relative to the circuit of FIG. 4. It will be appreciated that any number of variations are contemplated as falling within the scope of this disclosure. For example, additional switching elements could be positioned between the other columns to provide more flexibility, but also correspondingly introducing more complexity and area requirements for the end circuit.

Figure 8:
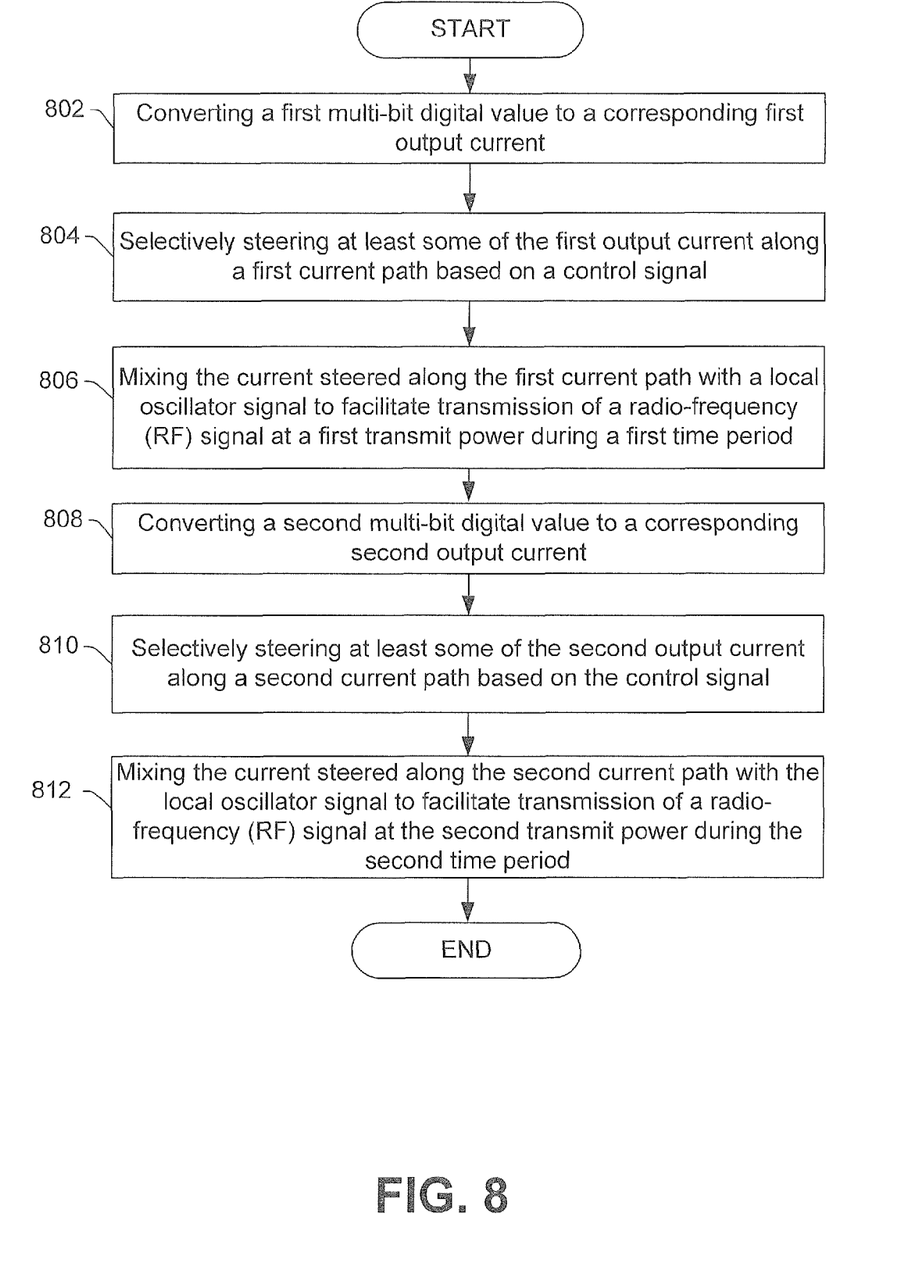
FIG. 8 is a flow chart illustrating a method in accordance with some embodiments.

FIG. 8 shows a method 800 in accordance with some embodiments. While this method is illustrated and described below as a series of acts or events, the present disclosure is not limited by the illustrated ordering of such acts or events. The same is true for other methods disclosed herein. For example, some acts may occur in different orders and/or concurrently with other acts or events apart from those illustrated and/or described herein. In addition, not all illustrated acts are required and the waveform shapes are merely illustrative and other waveforms may vary significantly from those illustrated. Further, one or more of the acts depicted herein may be carried out in one or more separate acts or phases.

The method starts at 802, when a first multi-bit digital value is converted to a corresponding first output current. This can be carried out by a DAC.

In 804, the first output current is steered along a first current path based on a control signal. In many implementations, the control signal can be provided from a control block (e.g., as discussed with respect to FIG. 4). However, in other implementations, the control signal can correspond to the multi-bit digital value itself.

In 806, the current steered along the first current path is mixed with a local oscillator signal to facilitate transmission of a radio-frequency (RF) signal at a first transmit power during a first time period. This block can be carried out by a mixer module in many implementations.

At 808, the method converts a second multi-bit digital value to a corresponding second output current. The second multi-bit digital value can differ from the first multi-bit digital value.

At 810, the second output current is selectively steered along a second current path based on the control signal.

At 812, the current steered along the second current path is mixed with the local oscillator signal to facilitate transmission of a radio-frequency (RF) signal at a second transmit power during the second time period. The second transmit power differs from the first transmit power. Although not shown in FIG. 8, it will be appreciated that the method 800 can continuously change its multi-bit digital value and control signal to transmit an RF signal over a number of different transmission powers.

Although the disclosure has been shown and described with respect to one or more implementations, equivalent alterations and modifications will occur to others skilled in the art based upon a reading and understanding of this specification and the annexed drawings. For example, although the concept of an RF DAC has been described above with respect to polar modulators, it will be appreciated that the concept is equally applicable to other modulations techniques, such as I/Q modulation. Thus, in other embodiments, the RF DAC with current steering is included in an IQ transmitter rather than a polar transmitter as illustrated herein. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:

1. A circuit, comprising:
   a digital to analog converter (DAC) configured to convert a time-varying, multi-bit digital value to a corresponding time-varying output current;
   a mixer module downstream of the DAC and comprising a plurality of mixers; and
   a control block configured to selectively steer output current from the DAC to different mixers of the mixer module;

wherein there are no filters coupled between the DAC and the mixer module.

2. The circuit of claim 1, wherein the DAC comprises:
a plurality of current sources that are independently and selectively enabled based on the time-varying multi-bit digital value provided to the DAC.

3. The circuit of claim 2, wherein the plurality of current sources comprise a plurality of transistors, respectively, and wherein a first transistor of a first current source has the same dimensions as a second transistor of a second current source.

4. The circuit of claim 2, further comprising:
a plurality of switches arranged to selectively couple the plurality of current sources to the plurality of mixers based on a control signal from the control block to selectively steer output current from the DAC to different mixers of the mixer module.

5. The circuit of claim 1, wherein a power amplifier is coupled downstream of the mixer module, and wherein the power amplifier is adapted to transmit RF signals at different powers over an RF antenna.

6. The circuit of claim 5, wherein the different powers are associated with at least two of the following communication standards: GMSK, EDGE, UMTS, LTE, WIMAX, 802.11, or Bluetooth.

7. The circuit of claim 1, wherein a mixer comprises:
a first pair of transistors having respective source/drain regions coupled to the DAC; and
a second pair of transistors having respective control terminals on which an enable signal is received, wherein the second pair of transistors is operable to selectively couple an output of the first pair of transistors to an RF antenna.

8. The circuit of claim 7, further comprising:
a power amplifier coupled to an output of the mixer, wherein the power amplifier has an output configured to be coupled to the RF antenna.

9. The circuit of claim 1, wherein the plurality of mixers are all of equal size.

10. A circuit to facilitate transmission of a radio frequency (RF) signal, comprising:
a plurality of mixers each having a pair of inputs and an output;
a digital to analog converter (DAC) comprising: a plurality of current sources that are independently and selectively enabled to deliver an output current whose current level is based on a multi-bit digital value provided to the DAC;
a switch matrix comprising a plurality of switching elements coupled between the DAC and the plurality of mixers, wherein, when a first multi-bit digital value is provided to the DAC, a first combination of multiple switches in the switch matrix steers the output current to concurrently deliver a first combination of current levels to the plurality of mixers; and wherein, when a second multi-bit digital value is provided to the DAC, a second, different combination of multiple switches in the switch matrix steers the output current to concurrently deliver a second, different combination of current levels to the plurality of mixers.

11. The circuit of claim 10, wherein there are no filters coupled between the DAC and the mixers.

12. The circuit of claim 10, wherein the plurality of current sources comprise a plurality of transistors, each transistor having the same dimensions to provide a unit current therefrom.

13. The circuit of claim 10:
wherein a first switch in the switch matrix has a first contact coupled to a first input of a first mixer and has a second contact coupled to a first current source in the DAC; and
wherein a second switch in the switch matrix has a first contact coupled to the first input of the first mixer and a second contact coupled to a second current source in the DAC.

14. The circuit of claim 13, wherein a second input of the first mixer is coupled to a local oscillator.

15. The circuit of claim 10:
wherein a first switch in the switch matrix has a first contact coupled to a first input of a first mixer and has a second contact coupled to a first current source in the DAC; and
wherein a second switch in the switch matrix has a first contact coupled to a first input of a second mixer and a second contact coupled to the first current source.

16. The circuit of claim 10, further comprising:
a power amplifier having an input and an output; and
an RF antenna having an input coupled to the output of the power amplifier;
wherein the plurality of mixers have their respective outputs coupled to the input of a power amplifier.

17. The circuit of claim 16, wherein the circuit is adapted to transmit RF signals in accordance with different communication standards over the RF antenna.

18. A circuit to facilitate transmission of a radio frequency (RF) signal, comprising:
a plurality of mixers each having a pair of inputs and an output;
a digital to analog converter (DAC) comprising: a plurality of current sources arranged in a series of rows and columns, wherein the plurality of current sources are independently and selectively enabled based on a multi-bit digital value provided to the DAC; and
a switch matrix comprising a plurality of switching elements coupled between the DAC and the plurality of mixers, wherein a first subgroup of switching elements have respective first contacts coupled to current sources along a column or row of the DAC and have respective second contacts coupled to different mixers in the plurality of mixers.

19. The circuit of claim 18, further comprising:
a control block to provide a control signal the switch to selectively couple the input of the first mixer to the first current source via the first switch.

20. A circuit to facilitate transmission of a radio frequency (RF) signal, comprising:
a plurality of mixers each having a pair of inputs and an output;
a digital to analog converter (DAC) comprising: a plurality of current sources that are independently and selectively enabled based on a multi-bit digital value provided to the DAC;
a switch matrix comprising a plurality of switching elements coupled between the DAC and the plurality of mixers, wherein a first switch in the switch matrix has a first contact coupled to a first input of a first mixer and a second contact coupled to an output of a first current source; and
a control block to provide a control signal to a control terminal of the switch to selectively couple the first input of the first mixer to the output of the first current source via the first switch;
wherein there are no filters coupled between the DAC and the mixers.

21. A circuit to facilitate transmission of a radio frequency (RF) signal, comprising:
- a plurality of mixers each having a pair of inputs and an output;
- a digital to analog converter (DAC) comprising: a plurality of current sources that are independently and selectively enabled based on a multi-bit digital value provided to the DAC;
- a switch matrix comprising a plurality of switching elements coupled between the DAC and the plurality of mixers;
- a control block to provide a control signal to the switch matrix,
- wherein a first value of the control signal causes the switch matrix to deliver current from at least two current sources of the plurality of current sources to a single mixer of the plurality of mixers, and
- wherein a second value of the control signal causes the switch matrix to concurrently deliver current of the at least two current sources to at least two different mixers of the plurality of mixers.

22. The circuit of claim 21, wherein a first switch in the switch matrix has a first contact coupled to a first input of a first mixer and a second contact coupled to an output of a first current source, and wherein a second switch in the switch matrix has a first contact coupled to the first input of the first mixer and a second contact coupled to a second current source in the DAC.

23. The circuit of claim 21, wherein a first switch in the switch matrix has a first contact coupled to a first input of a first mixer and a second contact coupled to an output of a first current source, and wherein a second switch in the switch matrix has a first contact coupled to a first input of a second mixer and a second contact coupled to the first current source.

* * * * *